US008234102B2

(12) United States Patent
Lange (10) Patent No.: US 8,234,102 B2
(45) Date of Patent: Jul. 31, 2012

(54) DEVELOPMENT OF ASSERTIONS FOR INTEGRATED CIRCUIT DESIGN SIMULATION

(75) Inventor: Tim Lange, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 540 days.

(21) Appl. No.: 12/066,109

(22) PCT Filed: Sep. 11, 2006

(86) PCT No.: PCT/IB2006/053218
§ 371 (c)(1),
(2), (4) Date: May 19, 2008

(87) PCT Pub. No.: WO2007/031938
PCT Pub. Date: Mar. 22, 2007

(65) Prior Publication Data
US 2008/0222205 A1    Sep. 11, 2008

(51) Int. Cl.
*G06F 17/50* (2006.01)
(52) U.S. Cl. .......................................... 703/14; 716/108
(58) Field of Classification Search .................. 703/14
See application file for complete search history.

(56) References Cited

U.S. PATENT DOCUMENTS

| | | | | |
|---|---|---|---|---|
| 6,513,143 | B1* | 1/2003 | Bloom et al. | 716/103 |
| 6,530,065 | B1* | 3/2003 | McDonald et al. | 716/102 |
| 7,051,299 | B2* | 5/2006 | Chadha et al. | 716/106 |
| 7,143,373 | B2* | 11/2006 | Moorby | 716/106 |
| 7,194,713 | B2* | 3/2007 | Iwashita | 716/102 |
| 7,236,917 | B1* | 6/2007 | Nouri et al. | 703/14 |
| 7,404,160 | B2* | 7/2008 | Piper et al. | 716/106 |
| 7,421,668 | B1* | 9/2008 | Ip et al. | 716/108 |
| 7,900,181 | B2* | 3/2011 | Hekmatpour et al. | 716/132 |
| 2005/0028035 | A1 | 2/2005 | Chadha et al. | |

FOREIGN PATENT DOCUMENTS

JP    2000305977 A    11/2000

OTHER PUBLICATIONS

Mentor Graphics, "QuickSim II Training Work Book", Software Version 8.5_1, 1995, pp. i-2-48, 7-1-7-44, 9-1-9-52, A-1-A-4, A-13, A-14, A-17.*
Written Opinion of the International Search Authority for PCT/IB2006/053218 (Mar. 12, 2008).*
Santarini, Mike, "Assertion Flow Debuts", EE Times, Nov. 17, 2003.*
Parikh, Tarak, "An Assertion Studio for SystemVerilog Users", HDL System Verilog Symposium, Dec. 2003.*
Maisniemi "Assertion-Based Verification With PSL Integrated With an Existing RTL Verification Environment" PLS/Sugar Consortium Meeting in Date '04, Feb. 19, 2004, pp. 1-5 Downloaded From: http://www.pslsugar.org/papers/PSLSUGAR_paper.pdf.
Peryer, M; et al "A Path Out of the Verification Wilderness" Electronics Systems and Software, vol. 2, No. 2, May 2004, pp. 33-37.
Kiyoharu Hamaguchi, "Basics and Aims of Assertion-Based Verification", IPSJ SIG Technical Reports, Jan. 25, 2005, pp. 29-34 (with English abstract).
Hiroshi Akira Akahoshi, "System Verilog Introduction to assertions Automatic debugging techniques to monitor the behavior of the tool internal signals", Design Wave Magazine, Sep. 2005, pp. 83-93 (with English abstract and partial translation).

* cited by examiner

*Primary Examiner* — Mary C Jacob (57) ABSTRACT

One embodiment of the present application includes the preparation of an assertion for inclusion in an integrated circuit simulation performed with a processing device (21). In response to an input to this processing device (21), a set of integrated circuit waveforms are defined to test the assertion. The processing device (21) tests the assertion with these waveforms; and after successful testing, the integrated circuit simulation is performed with the assertion.

23 Claims, 5 Drawing Sheets

DEVELOPMENT OF ASSERTIONS FOR INTEGRATED CIRCUIT DESIGN SIMULATION

The present invention relates to integrated circuit design verification, and more particularly, but not exclusively, relates to evaluation of assertions developed to verify an integrated circuit design.

Simulation techniques have been embraced to debug and otherwise evaluate the performance of electronic circuitry. Simulation is often performed with Hardware Description Language (HDL) models that specify the behavior of an integrated circuit design. HDL includes two commonly recognized standards: Verilog and VHDL. Alternate languages used to model integrated circuits include C. As the design of integrated circuitry continues to become more complex and difficult to cost-effectively simulate, the need for better integrated circuit design verification techniques increases. These needs are being fueled, for example, by demands for higher density Application Specific Integrated Circuits (ASICs), Field Programmable Gate Arrays (FPGAs), and System on a Chip (SoC) devices, to name just a few. As these increasing design verification needs have become recognized, further tools have arisen that are aimed at evaluating design performance during simulation.

Among these are the inclusion of logical "assertions" that can be applied during simulation to determine if certain desired design features are being realized. As used herein, an "assertion" is a statement about a specific behavioral attribute of an integrated circuit design that is expected to always evaluate to the expected result if the design is properly constituted. In typical usage, assertions evaluate to "TRUE" for the conditions specified. One pseudocode example of an assertion is: "one of six select lines must be active within ten cycles after a strobe line is activated." Assertions can be incorporated into a simulation as one or more written statements in a language that can be compiled into a form recognized by the particular simulator. For example, Property Specification Language (PSL), which is similar to Sugar, is used to define assertions with simulators provided by Cadence Design Systems. Cadence Design Systems has a business address of 2655 Seely Avenue, San Jose, Calif. 95134. "Declarative Language" and "Formal Property Language" are other terms sometimes used in connection with the preparation of assertion statements. Assertions have also been categorized as "procedural" that are described within the context of an executing set of sequential HDL statements, and "declarative" that are defined or exist within the structural context of the integrated circuit design.

The proper operation of a newly developed assertion is sometimes tested by inclusion in an integrated circuit design simulation. If the simulation results indicate that the tested assertion is not performing as desired, then the assertion is typically modified and recompiled, and then the simulation is repeated with the modified assertion. Unfortunately, simulations dedicated to assertion development can tie-up scarce processing resources, can be time-consuming, and/or can be expensive. Thus, there is a need for further contributions in this technical arena.

One embodiment of the present invention is a unique technique involving assertion developments for integrated circuit design verification or the like. Other embodiments include unique methods, systems, devices, and apparatus to evaluate assertions developed for integrated circuit design verification.

Another embodiment includes: preparing an assertion for an integrated circuit simulator, defining a set of integrated circuit waveforms selected to test the assertion, testing the assertion with the set of integrated circuit waveforms, and performing the integrated circuit simulation with the assertion after such testing is successful. In response to unsuccessful testing, the assertion can be modified and retested until desired behavior is realized. In one form, an assertion development tool is defined with a processing device to test and evaluate assertions relative to different sets of waveforms. These waveforms may be output by a simulator, and/or created/modified through a user interface. The assertion development tool can be provided with a simulator product.

Still another embodiment includes a display device, one or more input devices, and a processing device operatively coupled to the display device and the one or more input devices. The processing device includes a memory structured to store data representative of an assertion operable to verify behavior of an integrated circuit model and a first set of waveforms. The processing device is responsive to the one or more input devices to test operation of this assertion relative to the first set of waveforms and to provide a first output to a display device to visualize these waveforms and at least one indicator corresponding to the operation of the assertion. The processing device is further responsive to the one or more input devices to: generate a second set of waveforms customized to evaluate operation of a different assertion, store further data in the memory representative of the second set of waveforms and the different assertion, evaluate performance of the different assertion with the second set of waveforms, and provide a second output to the display to visualize the second set of waveforms and another indicator corresponding to the operation of the different assertion.

Yet a further embodiment includes a device with operating logic executable by a computing system to store a waveform database representative of a set of integrated circuit waveforms that each change in relation to a common period of time. The operating logic is further structured to perform an assertion evaluation by applying an assertion to the set of integrated circuit waveforms to test behavior of an integrated circuit design model, and provide an output corresponding to the assertion evaluation.

Accordingly, one object of the present invention is to provide a unique technique involving development of assertions to verify integrated circuit design.

Other objects include providing a unique method, system, device, or apparatus to evaluate an assertion developed for integrated circuit design simulation.

Further objects, embodiments, forms, aspects, benefits, advantages, and features of the present application and its inventions will become apparent from the figures and description provided herewith.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

One embodiment of the present invention is a logical assertion tool that is directed to evaluating operation of an assertion prior to use of the assertion in an integrated circuit design simulation. This tool responds to operator input through a user interface to define a set of integrated circuit waveforms selected for assertion evaluation, and to test the assertion with the integrated circuit waveforms. After successful testing, the integrated circuit design simulation is performed with the assertion.

Figure 1:
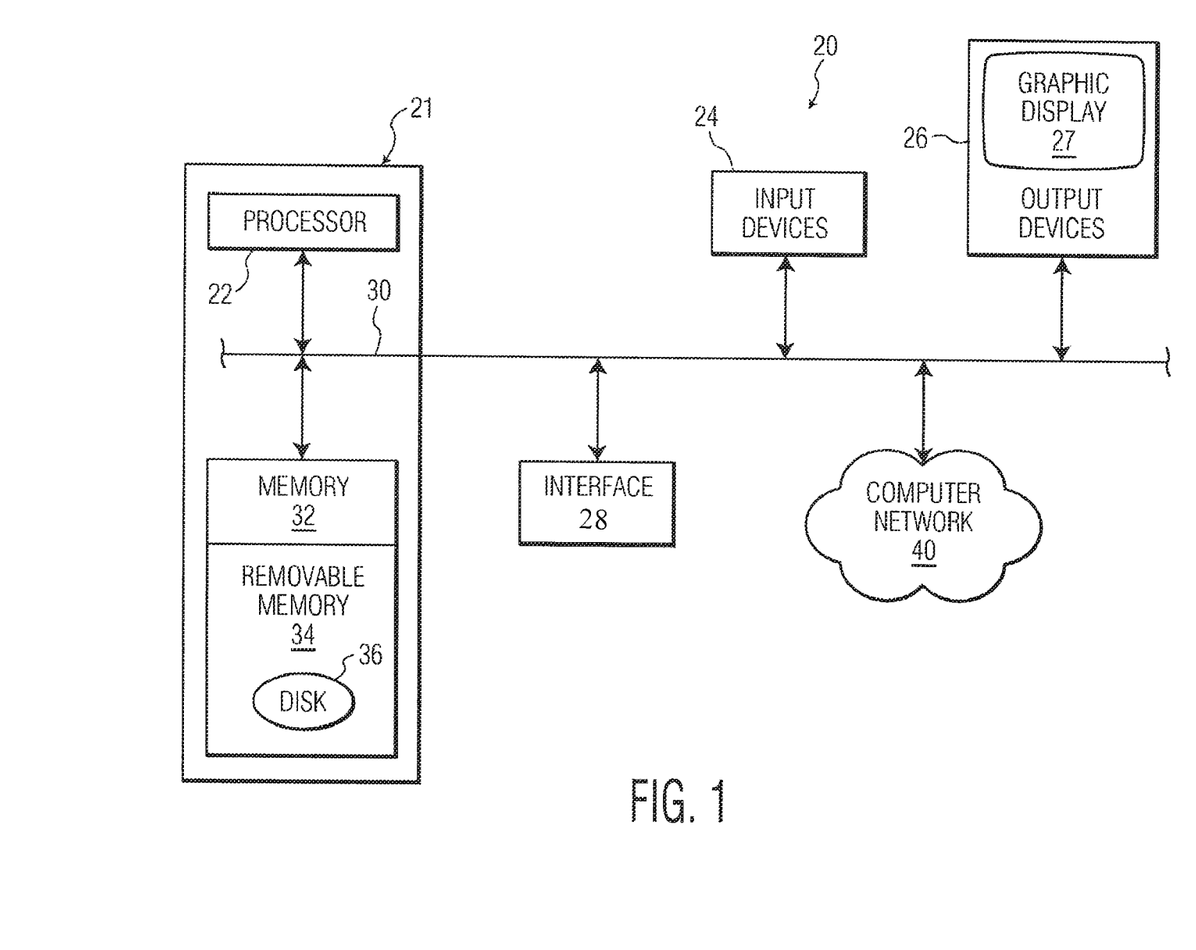
FIG. 1 is a diagrammatic view of a computer system.

FIG. 1 depicts computer processing system 20 of another embodiment of the present invention. System 20 includes processing device 21. Processing device 21 includes processor 22 and memory 32 coupled to bus 30. Processing device 21 may be provided in the form of a prepackaged computer unit, comprised of one or more hardware resources distributed on a computer network, or provided in such other form as would occur to those skilled in the art. In one embodiment, processor 22 is of the programmable, solid-state digital variety operable to execute instructions read from memory 32 via bus 30. Processor 22 performs operations in accordance with programming instructions and/or another form of operating logic, and more particularly is of a type suitable to perform simulation and related operations described hereinafter. In one form, processor 22 is integrated circuit-based, including one or more digital, solid-state central processing units each in the form of a microprocessor. It should be understood that while a single processor 22 is depicted, it is representative of multiprocessor arrangements as well as single processor arrangements. Further, processor 22 can be of a reduced instruction set (RISC) type, a complex instruction set (CISC) type, or a combination of both. For multiple processor forms, parallel and/or pipeline processing can be utilized as appropriate. Alternatively or additionally, processor 22 can be provided in the form of one or more components in a single unit or as multiple units. In one embodiment, processor 22 is in the form of one or more highly integrated, digital semiconductor devices.

Memory 32 can be of one or more types, such as solid-state electronic memory, magnetic memory, optical memory, or a combination of these. As illustrated in FIG. 1, memory 32 includes a removable/portable memory device 34. Removable memory device 34 includes disk memory 36 that can include an optical disk (such as a CD ROM or DVD) and/or a magnetically encoded hard disk, floppy disk, or the like. In other embodiments, removable memory device 34 can include a tape or cartridge form; and/or a different form as would occur to those skilled in the art. In one embodiment, at least a portion of memory 32 is operable to store programming instructions for selective execution by processor 22. Alternatively or additionally, memory 32 can be arranged to store data other than programming instructions for processor 22. In still other embodiments, memory 32 and/or removable memory device 34 may be absent.

System 20 also includes operator input devices 24, operator output devices 26, interface 28, and computer network 40 operatively coupled to processing device 21 by bus 30. Operator input devices 24 can include a standard mouse, keyboard, trackball, light pen, voice recognition subsystem, and/or different input device type as would occur to those skilled in the art. Operator output devices 26 include conventional graphic display 27, such as a color or noncolor plasma, Cathode Ray Tube (CRT), or Liquid Crystal Display (LCD) type; and may further include a printer, an aural output system and/or different output device type as would occur to those skilled in the art. In other embodiments, more or fewer operator input devices 24 and/or operator output devices 26 may be utilized. Interface 28 may be a modem or other type of communications and/or equipment interface. In other embodiments, interface 28 may be absent.

System 20 also includes computer network 40, which can be a Local Area Network (LAN); Municipal Area Network (MAN); Wide Area Network (WAN), such as the Internet; another type as would occur to those skilled in the art; or a combination of these. Network 40 can couple processing device 21 to one or more other computers that can be arranged as client and server, respectively, in relation to some or all of the processing performed with system 20. For this arrangement, it should be understood that many other remote computers could be included as clients of device 21, but are not shown to preserve clarity. In another embodiment, device 21 and one or more other computers can be participating members of a distributed processing arrangement with one or more processing units at a different site relative to others. The distributed processors of such an arrangement can be used collectively to execute routines according to the present invention. It should be further understood that network 40 can be used as an alternative to interface 28, and/or interface 28 can provide an additional networking connection. In still other embodiments, network 40 may be absent.

Operating logic for processor 22 is arranged to facilitate performance of various routines, subroutines, computer models, simulations, procedures, stages, operations, and/or conditionals described hereinafter. This operating logic can be of a dedicated, hardwired variety and/or in the form of programming instructions as is appropriate for the particular processor arrangement. Such logic can be at least partially encoded on removable memory device 34 (such as disk memory 36) for storage and/or transport to another computer. Alternatively or additionally, the operating logic of processing device 21 can be in the form of one or more signals carried by a transmission medium, such as network 40.

Figure 2:
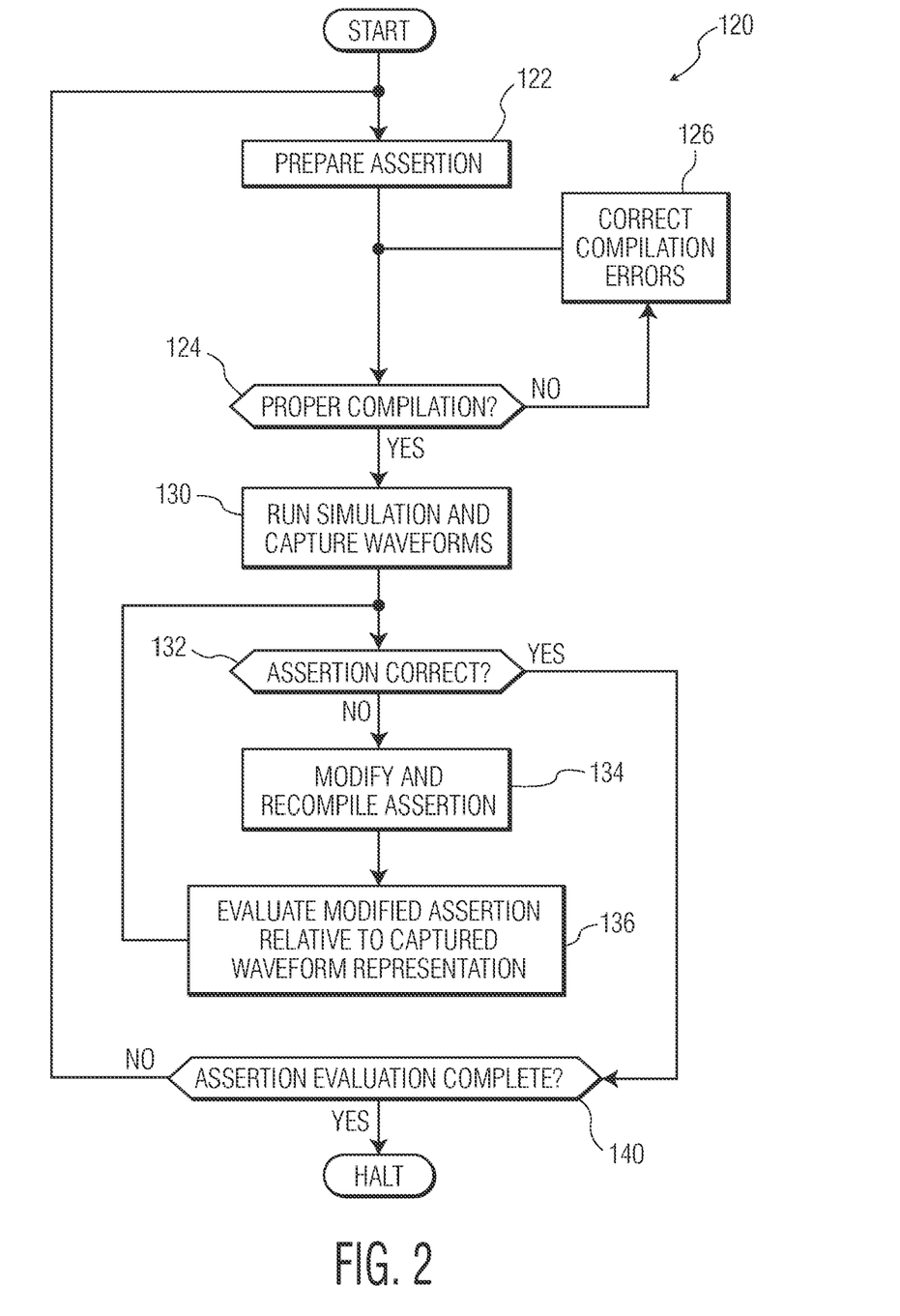
FIG. 2 is flowchart of one procedure to develop assertions that can be implemented with the system of FIG. 1.

The flowchart of FIG. 2 illustrates assertion development procedure 120 that can be implemented with system 20. In procedure 120, an assertion is initially prepared in operation 122. For operation 122, operating logic of processor 21 typically defines a suitable user interface that is responsive to operator input from one or more of input devices 24, and provides output to the operator with one or more of output devices 26. Preparation of the assertion includes compiling it into an executable form as part of an integrated circuit simulation, or for inclusion in such simulation.

From operation 122, procedure 120 continues with conditional 124. Conditional 124 tests if the compilation of the assertion was properly performed. If the test of conditional 124 is negative (false), operation 126 of procedure 120 is performed. In operation 126, compilation errors are addressed and the assertion is recompiled. After execution of operation 126, procedure returns to conditional 124 to again test for proper compilation. If the test of conditional 126 is affirmative (true), procedure 120 continues with operation 130. In operation 130, an integrated circuit simulation is run with the compiled assertion.

Figure 3:
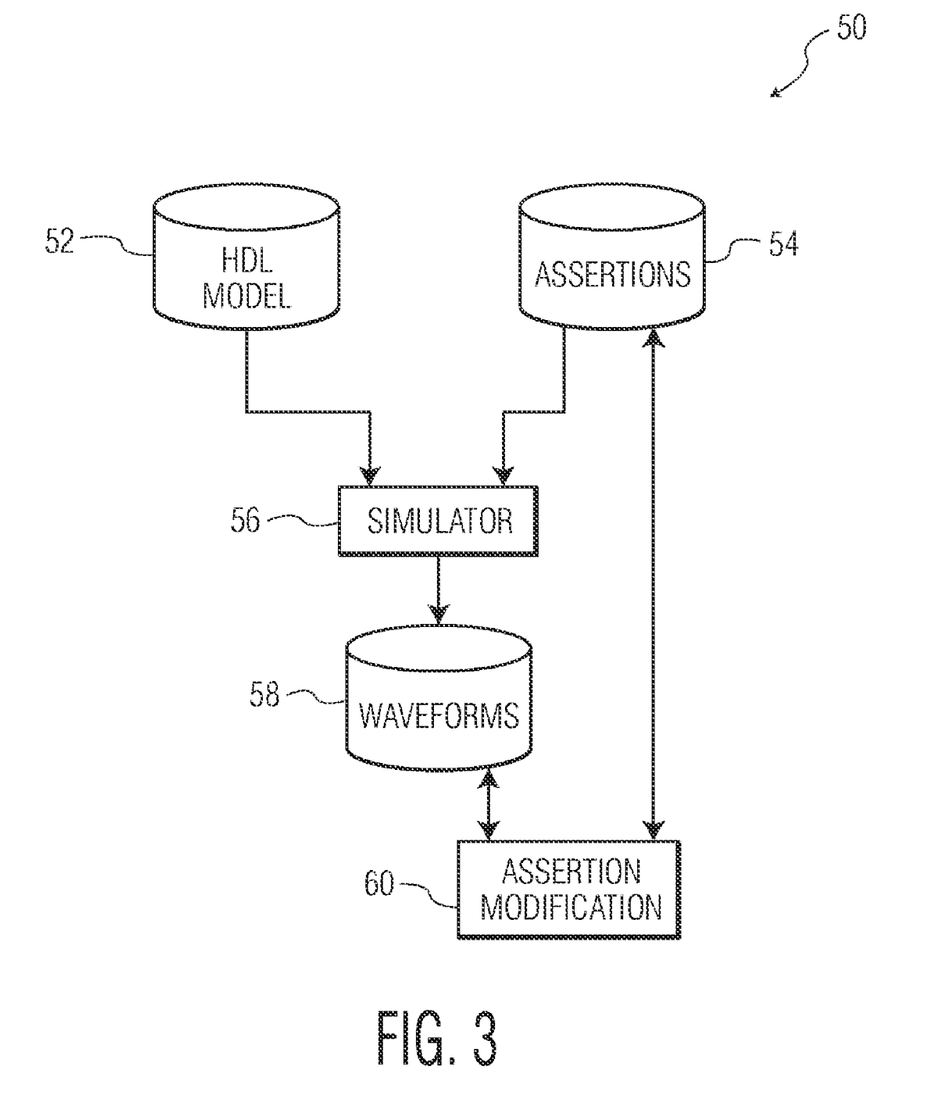
FIG. 3 is a diagrammatic view of logical tools used in the procedure of FIG. 2.

Referring additionally to FIG. 3, logical tools 50 corresponding to procedure 120 are symbolically shown. HDL model 52 represents the code and data associated with modeling integrated circuitry in an HDL format. Assertions source 54 represents assertions that are selected to verify proper behavior of HDL model 52. Model 52 and the assertions source 54 are applied together during integrated circuit simulation with simulator 56. In correspondence, the simulation executed in operation 130 of procedure 120 is performed by simulator 56 (FIG. 3), using the assertion prepared in operation 122 and HDL model 52.

The results output by simulator 56, and correspondingly operation 130, include digital waveforms over a representative period of time. Data representative of these integrated circuit waveforms can be captured and analyzed to evaluate simulation and/or assertion performance. Waveform database 58 of FIG. 3 corresponds to the captured waveform data output by simulator 56 in operation 130.

Procedure 120 proceeds from operation 130 to conditional 132 to test if the assertion being evaluated performed correctly during the simulation. This test can involve determining whether the assertion or other possible deficiencies are evidenced by the simulation. If the test of conditional 132 is negative (false), then procedure 120 continues with operation 134. In operation 134, the assertion under development is modified and recompiled. These aspects are represented by assertion modification and evaluation tool 60 in FIG. 3.

From operation 134, the modified assertion is re-evaluated in operation 136. In operation 136, instead of using the more involved process of performing a full simulation again with the modified assertion, the modified assertion is evaluated relative to the captured integrated circuit waveforms. From operation 136, procedure 120 returns to conditional 132 to determine if the modified assertion as applied to the captured waveforms is operating correctly. It should be understood that only waveforms corresponding to the circuit nodes being tested by the assertion need to be utilized. The loop through operations 134 and 136 and back to conditional 132 is repeated until the test of conditional 132 is affirmative (true). Correspondingly, assertion modification and evaluation tool 60 is linked to source 54 to provide updated assertions and also linked to waveform database 58 to test assertions with waveforms.

Once the test of conditional 132 is affirmative, conditional 140 is encountered. Conditional 140 tests whether assertion evaluation is complete. If the test of conditional 140 is affirmative (true), then procedure 120 halts. If the test of conditional 140 is negative (false), then procedure 120 loops back to operation 122 to prepare and evaluate another assertion. It should be appreciated that procedure 120 reduces simulation time by utilizing waveform data pertinent to assertion evaluation for assertions under development instead of executing a complete simulation with each assertion change. Once an assertion is validated in this way, it can be applied in simulations with higher confidence of correctness. In one implementation, procedure 120 is provided as an assertion evaluation and/or development tool within an integrated circuit simulation product. In other embodiments, it may be provided as a standalone tool.

Figure 4:
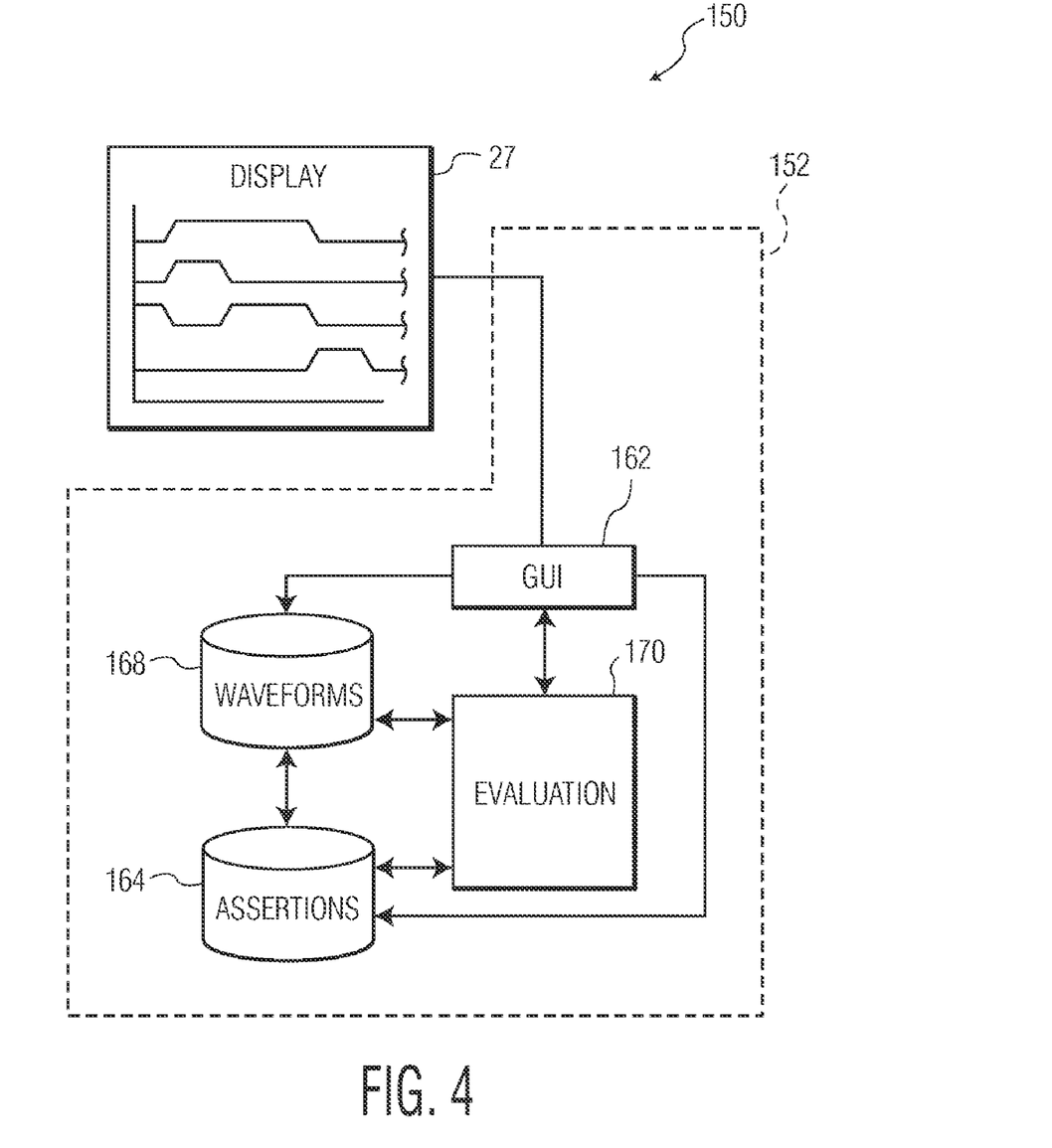
FIG. 4 is a diagrammatic view of an assertion development tool that can be implemented with the system of FIG. 1.
Figure 5:
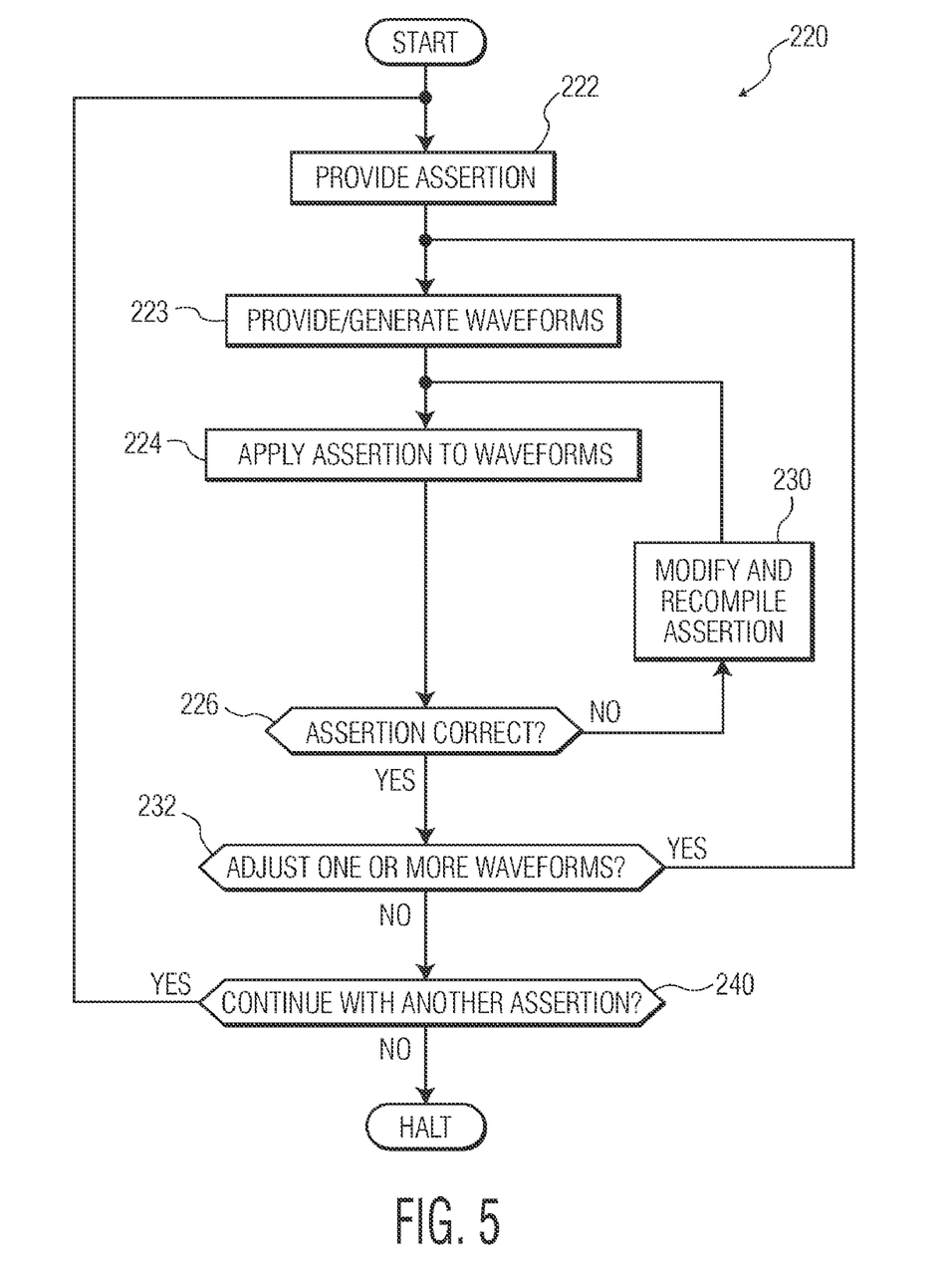
FIG. 5 is a flowchart of another procedure that can be implemented with the system of FIG. 1 to provide the assertion development tool of FIG. 4.

Referring to FIG. 4, another embodiment of an assertion development tool 150 is illustrated. Development tool 150 can also be implemented with system 20 with data and operations 152 being more specifically defined through operating logic executed with processing device 21. In connection with FIG. 4, the flowchart of FIG. 5 illustrates one mode of operating assertion development tool 150 as procedure 220. Procedure 220 begins with operation 222, in which a compiled assertion is provided for evaluation 170. The selection and preparation of this assertion may be provided through operation input devices 24 and/or operator output devices 26 via a suitable user interface. In FIG. 4, a Graphical User Interface (GUI) 162 is symbolically presented that can be defined by operating logic of processing device 21. GUI 162 can provide the appropriate operator interfacing to select an assertion that already has been prepared and compiled from assertions database 164 of development tool 150, to prepare and compile an assertion for subsequent inclusion in assertions database 164, and/or to modify an assertion already included in assertions database 164.

From operation 222, procedure 220 continues with operation 223. In operation 223, waveforms for the evaluation of the assertion are selected, modified, or otherwise created through GUI 162. The selected waveforms can be customized to correspond to just those circuit nodes being tested with the provided assertion. The waveforms are stored in waveform database 168 (FIG. 4). At least some of these waveforms may be of the type initially captured from an integrated circuit simulation. Alternatively or additionally, waveforms stored in database 168 may be modified from captured waveform data and/or may be created by an operator through GUI 162. In one particular form of GUI 162, waveforms are graphically shown on display 27 to assist an operator in creating/modifying/selecting waveforms in operation 223.

From operation 223, procedure 220 continues with operation 224. In operation 224, the assertion is applied to waveforms provided in operation 123 from database 168. After the assertion is applied to waveforms in operation 224, procedure 220 continues with conditional 226. Conditional 226 tests whether the assertion performed correctly or not. If the test of conditional 226 is negative (false), operation 230 is performed. In operation 230, the assertion is modified and recompiled, and then procedure returns to operation 224 to reapply it to the waveforms for evaluation purposes.

If the test of conditional 226 is affirmative (true), then procedure 220 continues with conditional 232 to test if any of the waveforms should be adjusted to perform further evaluation of the assertion. If the test of conditional 232 is affirmative (true), then procedure 220 returns to operation 223 to provide/generate waveforms. If the test of conditional 232 is negative (false), then procedure 220 continues with conditional 240. Conditional 240 tests whether to continue with another assertion or halt. If the test of conditional 240 is affirmative (true), procedure 220 loops back to operation 222 to provide/prepare another assertion for evaluation/development. If the test of conditional 240 is negative (false), then procedure 220 halts. Tool 150 and/or procedure 220 can be provided as part of a simulation platform or provided standalone. As in the case of procedure 120 and tools 50, tool 150 and procedure 220 utilize previously saved waveforms to evaluate assertions—making it possible to more sparingly perform simulations during assertion development.

Many other embodiments are contemplated. For example, the procedures, conditionals, operations, tools, and other features of FIGS. 2-5 can be ordered differently, combined, duplicated, substituted, or the like in other embodiments of the present invention. In a further example, assertion development is based on circuit emulation and/or Field Programmable Gate Array verification as controlled with an appropriately adapted processing device. In another example, an apparatus comprises a processing device with a memory storing an integrated circuit design assertion and a waveform database. The processing device includes: means for generating a first set of integrated circuit waveforms customized to an assertion, the first set of integrated circuit waveforms being stored in the database; means for performing a first assertion evaluation by applying the assertion to the first set of integrated circuit waveforms; means for selectively modifying the assertion in response to outcome of the first assertion evaluation; and means for performing a second assertion evaluation of the assertion after being changed with the modifying means.

Still another example includes a computer system with means for preparing an assertion for an integrated circuit simulation; means for defining a set of integrated circuit waveforms selected to test the assertion in response to input with one or more input devices; means for testing the assertion with the integrated circuit waveforms; and means for performing the integrated circuit simulation with the assertion after testing.

A further example includes providing a waveform database for integrated circuit simulation that corresponds to several integrated circuit waveforms. These waveforms each change in relation to a common period of time. This embodiment further includes applying a first assertion to such waveforms with a processing device that is structured to test behavior of an integrated circuit design model corresponding to the waveforms. The first assertion is evaluated based on this application, and in response to this evaluation the first assertion is modified to provide a second assertion to test behavior of the integrated circuit design model.

In yet a further example, a device includes operating logic executable by a computer system to prepare an assertion to verify behavior of an integrated circuit design model through simulation and define a set of integrated circuit waveforms selected to evaluate the assertion in response to input from one or more operator input devices of the computer system. This operating logic is executed to provide an output to a display included in the computer system to visualize the set of integrated circuit waveforms. The operating logic responds to input from the one or more operator input devices to modify or create one or more of the set of integrated circuit waveforms to perform assertion evaluation. Also, the operating logic is operable to test operation of the assertion with the integrated circuit waveforms and perform the simulation with the integrated circuit design model and the assertion after determining the operation of the assertion is acceptable.

While the invention has been illustrated and described in detail in the drawings and foregoing description, the same is to be considered as illustrative and not restrictive in character, it being understood that only selected embodiments have been shown and described and that all changes, modifications and equivalents that come within the spirit of the inventions described heretofore and/or defined by the following claims are desired to be protected.

What is claimed is:

1. A method comprising:
   providing a waveform database, the database corresponding to several integrated circuit waveforms that each change in relation to a common period of time;
   applying a first assertion to a selected one of the integrated circuit waveforms with a processing device to test behavior of the first assertion;
   evaluating the first assertion based on the applying; and in response to the evaluating, modifying the first assertion to provide a second assertion to test the behavior of an integrated circuit design model.

2. The method of claim 1, which includes customizing a different set of integrated circuit waveforms relative to a different assertion with a graphical user interface, defined by the processing device.

3. The method of claim 1, which includes providing the waveform database and performing the applying of the first assertion with an assertion development tool, at least partially defined by programming of the processing device.

4. The method of claim 3, wherein the waveform database is provided by storing waveform data generated with a simulator.

5. The method of claim 1, which includes performing an integrated circuit simulation with the integrated circuit design model and including the second assertion in the simulation.

6. The method of claim 1, wherein the modifying includes recompiling to provide the second assertion, the first assertion and the second assertion being provided in Property Specification Language (PSL).

7. A method, comprising:
   preparing an assertion for an integrated circuit simulation in response to input to a processing device;
   defining a set of integrated circuit waveforms selected to test the assertion with the processing device;
   testing the assertion with the integrated circuit waveforms; and
   after successful testing, performing the integrated circuit simulation with the assertion.

8. The method of claim 7, wherein the defining of the set of integrated circuit waveforms and the testing of the assertion are performed with an assertion development tool provided with the processing device, the processing device, being operatively coupled to a display responsive to the assertion development tool to display a graphical representation of the integrated circuit waveforms.

9. The method of claim 7, which includes customizing a different set of integrated circuit waveforms relative to a different assertion with a graphical user interface defined by the processing device.

10. The method of claim 7, wherein the simulation is performed with an HDL model and the assertion is defined in Property Specification Language (PSL).

11. The method of claim 7, which includes modifying the assertion in response to the testing, recompiling the assertion after modification, and repeating the testing, the performing of the integrated circuit simulation being executed after the repeating.

12. The method of claim 11, wherein the defining of the set of integrated circuit waveforms, the testing of the assertion, and the simulation are performed in accordance with programming of the processing device.

13. A system, comprising:
    a display device;
    one or more input devices; and a processing device operatively coupled to the display device and the one or more input devices, the processing device including a memory structured to store data representative of an assertion operable to verify behavior of an integrated circuit model and a first set of waveforms, the processing device being responsive to the one or more input devices to test operation of the assertion relative to a selected one of the first set of waveforms, the display being responsive to a first output from the processing device to visualize the first set of waveforms and at least one indicator corresponding to the operation of the assertion, the processing device being further responsive to the one or more input devices to:
    generate a second set of waveforms customized to test operation of a different assertion,
    store further data in the memory representative of the second set of waveforms and the different assertion,
    evaluate performance of the different assertion with a selected one of the second set of waveforms, and
    generate a second output to the display to visualize the second set of waveforms and provide another indicator corresponding to the operation of the different assertion.

14. The system of claim 13, further comprising means for graphic user interfacing to interactively create and modify waveform data.

15. The system of claim 13, wherein the processing device is further operable to store a database of assertions and a waveform database, the waveform database including the first set of waveforms and the second set of waveforms.

16. The system of claim 13, which includes means for performing the assertion based on an HDL model.

17. The system of claim 13, further comprising means for modifying the assertion based on tested operation thereof.

18. The system of claim 13, wherein the processing device is configured and arranged to define the sets of waveforms as including waveforms that change in relation to a common period of time, the waveforms being configured and arranged for testing the operation of the assertion and being independent from the integrated circuit model to which the assertions are to be applied.

19. An apparatus, comprising:
a device including operating logic executable by a computer system to prepare an assertion that is configured and arranged to verify behavior of an integrated circuit design model through simulation and define a set of integrated circuit waveforms selected to evaluate the assertion in response to input from one or more operator input devices of the computer system, the operating logic being stored on a non-transitory medium and being executable by the computer system to
provide an output to visualize the set of integrated circuit waveforms on a display included in the computer system,
respond to input from the one or more operator input devices by modifying or creating one or more of the set of integrated circuit waveforms to perform assertion evaluation, and
test operation of the assertion with the integrated circuit waveforms and performing the simulation with the integrated circuit design model and the assertion after determining the operation of the assertion is acceptable.

20. The apparatus of claim 19, wherein the device is a removable disk memory encoded with the operating logic.

21. The apparatus of claim 19, wherein the device is at least a portion of a computer network including the non-transitory medium carrying encoded signals corresponding to the operating logic.

22. The apparatus of claim 19, wherein the operating logic is further operable by the computer system to perform assertion modification.

23. The apparatus of claim 19, wherein the operating logic is executable by the computer system to define the set of waveforms by defining waveforms in the set that change in relation to a common period of time, the waveforms being configured and arranged for testing the assertion and being independent from the integrated circuit design model to which the assertions are to be applied.

* * * * *